United States Patent [19]

Nobukata

[11] Patent Number: 5,521,868
[45] Date of Patent: May 28, 1996

[54] NOR-TYPE NON-VOLATILE MEMORY USING TUNNEL CURRENT AND HAVING SELECTIVE RE-WRITE

[75] Inventor: Hiromi Nobukata, Kanagawa, Japan

[73] Assignee: Sony Corporation, Tokyo, Japan

[21] Appl. No.: 284,228

[22] Filed: Aug. 2, 1994

[30] Foreign Application Priority Data

Aug. 11, 1993 [JP] Japan .................................. 5-199798

[51] Int. Cl.[6] ................................................... G11C 7/00
[52] U.S. Cl. .............................. 365/185.22; 365/185.27; 365/201; 365/185.26; 371/21.4
[58] Field of Search ............................. 365/189.01, 201, 365/218, 185, 238.5, 210; 371/21.4, 21.5

[56] References Cited

U.S. PATENT DOCUMENTS

| | | | |
|---|---|---|---|
| 5,053,990 | 10/1991 | Kreifels et al. | 365/185 X |
| 5,172,338 | 12/1992 | Mehrotra et al. | 365/185 |
| 5,321,699 | 6/1994 | Endoh et al. | 365/201 X |
| 5,357,462 | 10/1994 | Tanaka et al. | 365/185 |

FOREIGN PATENT DOCUMENTS

| | | |
|---|---|---|
| 0541222 | 5/1993 | European Pat. Off. . |
| 0547640 | 6/1993 | European Pat. Off. . |

*Primary Examiner*—David C. Nelms
*Assistant Examiner*—Son Dinh
*Attorney, Agent, or Firm*—Ronald P. Kananen

[57] ABSTRACT

The present invention permits the re-writing of data selectively only in cells in which data is written incompletely. A non-volatile memory is set in a re-write mode when a bit line voltage is high (H). In the re-write mode, a sense amplifier and a selected cell are activated. Because latched data in the sense amplifier is high (H), the electrons in the selected cell produce FN-tunneling, thereby writing data "0" in the selected cell. Because the bit line level of voltage (BLR) of the other cells in which data is written completely is reduced to a low level (L), the latched data in the sense amplifier is reduced to a low level (L). Accordingly, when the word line of a selected cell is connected to other cells in which data is written completely, because data is prevented from being re-written in said other cells, the threshold levels of the various cells remain equal and do not become distributed broadly.

7 Claims, 14 Drawing Sheets

| WRITTEN DATA | STATE OF READ CELL | BIT LINE BL LEVEL |
|---|---|---|
| 0 | (1) IT IS DETERMINED BY THE FIRST VERIFICATION THAT THE CELL IS PROGRAMMED INCOMPLETELY | REMAINING THE LEVEL JUST AFTER READING |
| | (2) IT IS DETERMINED BY THE LAST VERIFICATION THAT THE CELL IS PROGRAMMED INCOMPLETELY | 0V |
| 1 | IT IS DETERMINED BY THE LAST VERIFICATION THAT THE CELL IS PROGRAMMED COMPLETELY UNCHANGED | 0V |

FIG. 7

| STATE OF CELL | COMPARISON OF BIT LINE LEVEL | LATCHED DATA IN READ CELL SIDE | LATCHED DATA IN DUMMY CELL SIDE |
|---|---|---|---|
| WRITTEN (PROGRAMMED) INCOMPLETELY | READ CELL SIDE > DUMMY CELL SIDE | H | L |
| WRITTEN (PROGRAMMED) COMPLETELY | READ CELL SIDE < DUMMY CELL SIDE | L | H |
| DATA "1" IS WRITTEN IN A CELL AND IT IS DETERMINED THAT THE DATA IS WRITTEN COMPLETELY IN THE CELL IN THE LAST VERIFICATION | READ CELL SIDE < DUMMY CELL SIDE | L | H |

FIG. 8

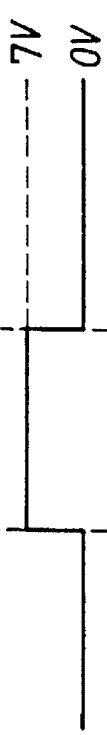
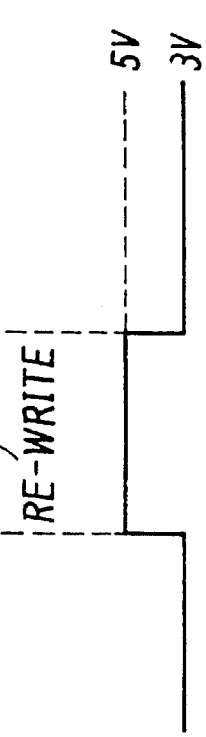
FIG. 9A  POWER-SUPPLY VOLTAGE SAH
FIG. 9B  POWER-SUPPLY VOLTAGE SAL
FIG. 9C  WORD LINE LEVEL WLi
FIG. 9D  GATE VOLTAGE Va
FIG. 9E  GATE VOLTAGE Vb
FIG. 9F  LATCHED LEVEL IN READ CELL SIDE

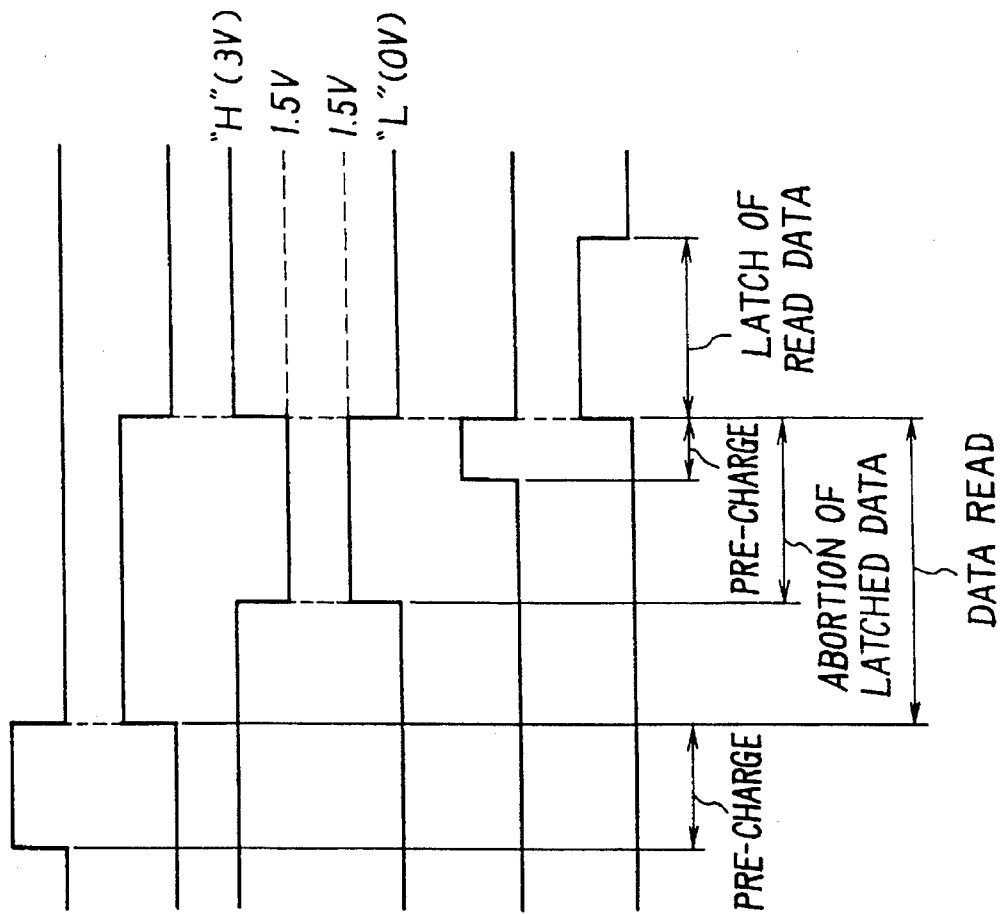
FIG.12A  GATE VOLTAGE $V_{pa}, V_{pv}$
FIG.12B  WORD LINE LEVEL $WLi$
FIG.12C  POWER-SUPPLY VOLTAGE $SAH$
FIG.12D  POWER-SUPPLY VOLTAGE $SAL$
FIG.12E  GATE VOLTAGE $V_e$
FIG.12F  CONTROL VOLTAGE $V_a, V_b$

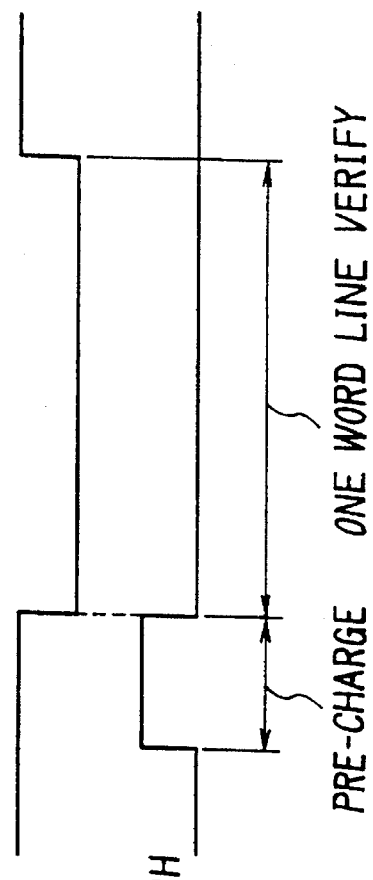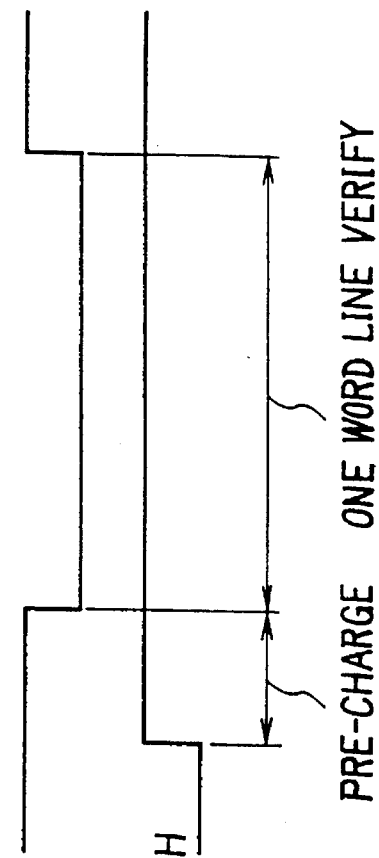

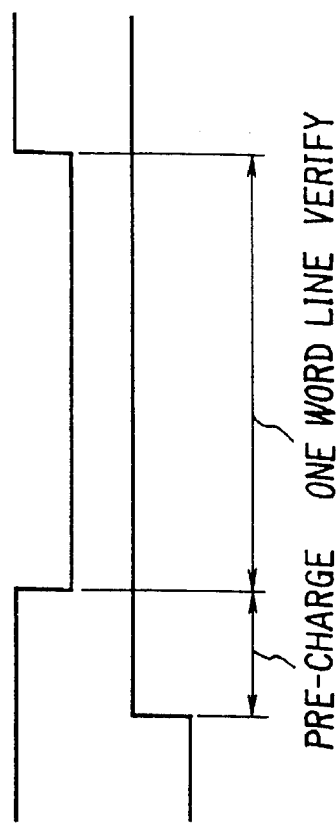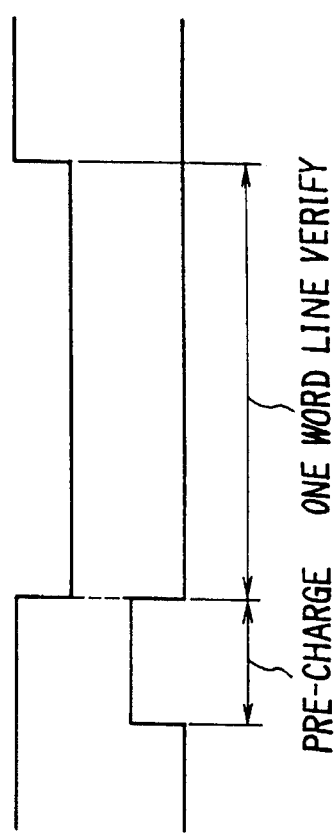

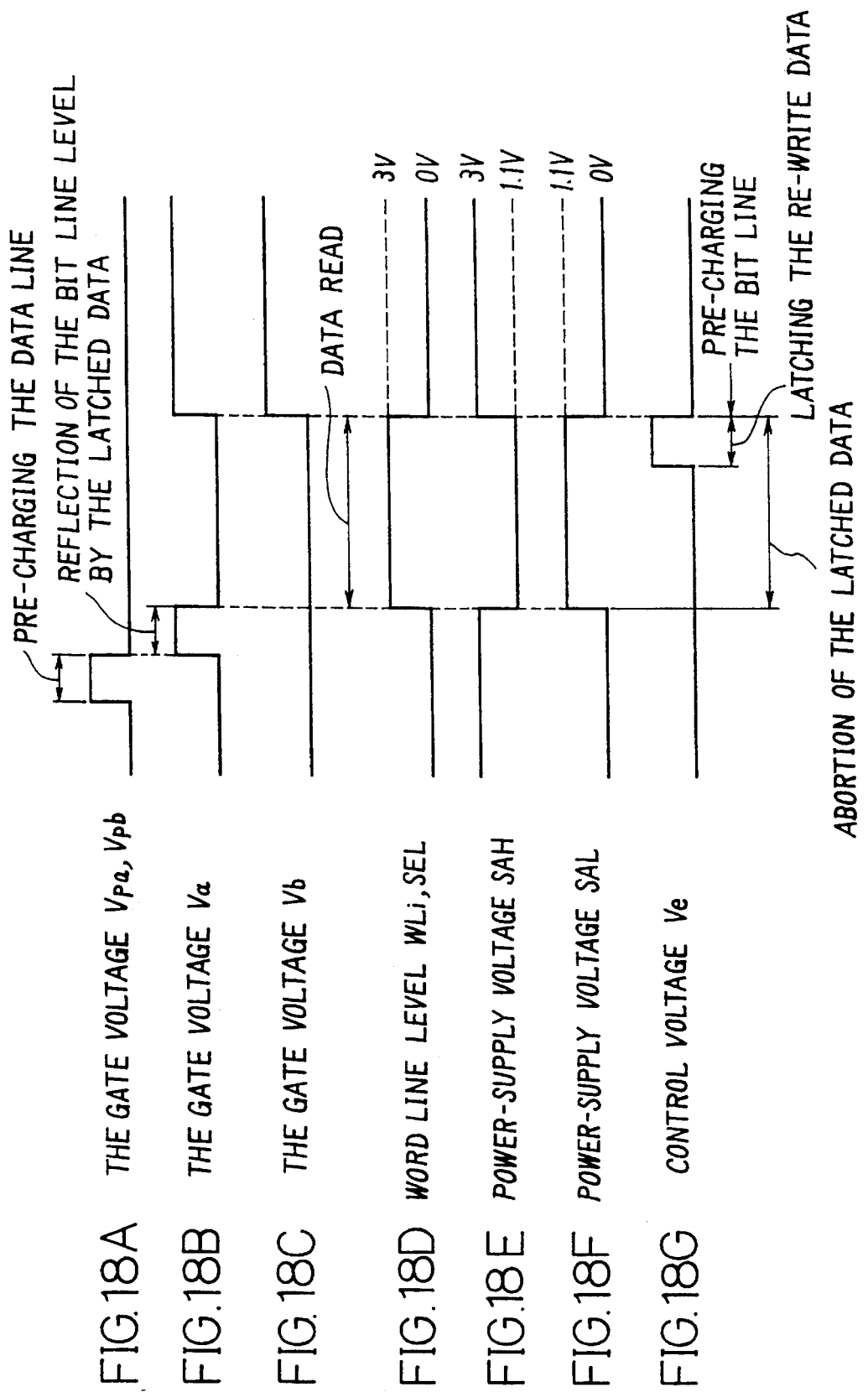

NOR-TYPE NON-VOLATILE MEMORY USING TUNNEL CURRENT AND HAVING SELECTIVE RE-WRITE

BACKGROUND OF THE INVENTION

1. Field of the Invention

This invention relates to a NOR-type non-volatile semiconductor memory device for writing and erasing data by a tunnel current.

2. Description of the Related Art

A non-volatile semiconductor memory, such as the flash EEPROM, is reaching the limits of a write operation using CHE (Channel Hot Electron) because the power-supply for the memory tends to be of a lower voltage (3.0 or 3.3 volts).

A NOR-type non-volatile memory, which writes and erases data using the FN-tunnel current (Fowler-Nordheim Tunneling Current) with a low voltage power-supply, is preferable to the CHE memory.

The non-volatile memory which writes and erases data using the tunnel current is able to write and erase with a low voltage power-supply or a boosted voltage because little current flows in the memory.

However, the write operation using FN-tunneling has a disadvantage of taking a longer time than the write operation using CHE. For example, while the write operation using CHE takes tens of microseconds, the write operation using the FN-tunneling takes several milliseconds.

In order to solve this problem, for example, it would be possible to write by latching one word line of data from a word line (corresponding to a row line) established in a memory cell, using a single word line as a writing unit, in other words, writing latch data on a page basis. Since the time necessary for writing on a per byte basis could be reduced, the writing time should be comparable to that for the CHE type operation.

However, this leads to a new problem, described below, which occurs in the paginal write operation. After the paginal write operation, a verify operation determines whether or not the data are written in the cell completely and accurately enough to be later correctly read.

Threshold levels for writing for the cells connected to the word line are not at all the same and there is some degree of variation. Therefore, the more often re-writing is undertaken, the wider the variation in threshold levels will become and the more significantly broad the dispersal of such threshold levels for the cells connected to the word line will become.

When the threshold levels for the cells become significantly different, the margins will be insufficient, thereby making the reading itself as well as the control of such reading difficult.

OBJECT AND SUMMARY OF THE INVENTION

It is accordingly an object of the invention to provide an improved NOR-type non-volatile semiconductor memory, which writes the data only in cells in which data has been written incompletely or inaccurately to the extent that it can not be later correctly read.

The present invention, with its special characteristic of an anti-selection voltage which prevents the writing of data in the cells in which data has been satisfactorily written at the time of re-writing, after verification has occurred, solves the above-described problem. This is accomplished through a cell control means, having a sense amplifier in each bit line, which performs the operations of writing and erasing data using a tunnel current and which can repeatedly write and verify data on a word line basis.

The write operation is defined as the writing of the data "0" (in short, programming) in a cell. As shown in FIG. 4, in the write operation, the latched level of a read cell side (the "RC side") of a sense amplifier 20 is high (a high logic level H which is equal to a power-supply voltage SAH).

If the data is written incompletely in the cell, no cell current flows because the threshold voltage Vth of the cell is not lower than the word line voltage. Therefore, as shown in FIG. 6, even if a cell side becomes active after a bit line of the RC side is pre-charged in the verify mode, no cell current flows and the bit line holds the pre-charged level.

The bit line level is amplified and latched in the sense amplifier 20.

When the bit line level BLR is high (H), the memory is in a re-write mode. As shown in FIG. 9, the sense amplifier 20 and the selected cell are controlled in the write mode. Because the latched data in the sense amplifier 20 is high (H), data "0" is written in the selected cell through the FN-tunneling of electrons.

With regard to a cell in which the data is written completely, the bit line BLR connected to it drops to a low logic level L when in the verify mode causing the latched data in the sense amplifier 20 to drop to a low level L, Accordingly, even if the word line is connected to a cell in which the data is written completely, data is prevented from being re-written in the cell.

As described above, because the data in a cell in which the data is written completely is not re-written, the threshold levels of respective cells remain approximately the same (as shown in FIG. 10) and do not show a broad distribution.

These and other objects and many of the attendant advantages of this invention will be readily appreciated as the same becomes better understood by reference to the following detailed description, considered in conjunction with the accompanying drawings.

BRIEF DESCRIPTION OF THE DRAWINGS

FIG. 7 is a table for explaining the correlation between a read cell side and the bit line level;

FIG. 8 is a table for explaining the correlation between latched data;

FIG. 9, comprised of FIGS. 9A–9F, is a wave form chart for explaining the re-writing data "0" mode;

FIG. 12, comprised of FIGS. 12A–12F, is a wave form chart for explaining the read mode;

FIG. 13, comprised of FIGS. 13A and 13B is a wave form chart for explaining the program verify mode;

FIG. 14, comprised of FIGS. 14A and 14B is a wave form chart for explaining the program verify mode;

FIG. 15, comprised of FIGS. 15A and 15B is a wave form chart for explaining the erase verify mode;

FIG. 16, comprised of FIGS. 16A and 16B is a wave form chart for explaining the erase verify mode;

FIG. 18, comprised of FIGS. 18A–18G, is a wave form chart for explaining the operation of the second embodiment of the present invention.

DESCRIPTION OF THE PREFERRED EMBODIMENT

A NOR-type non-volatile memory control circuit, according to the present invention, is described below with reference to the accompanying drawings.

Figure 1:
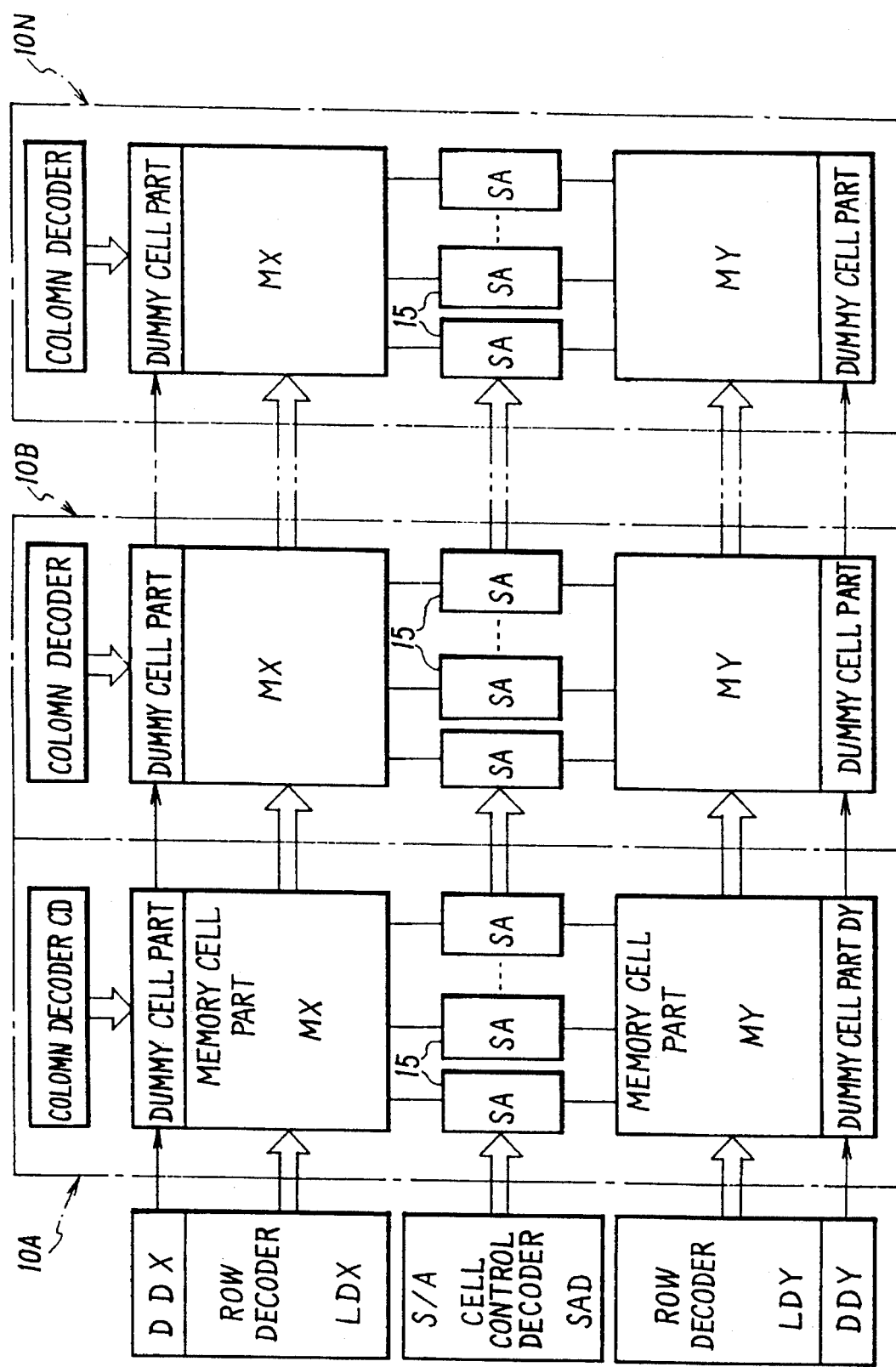
FIG. 1 is a systematic diagram illustrating a principal part of a NOR-type non-volatile memory control circuit according to the present invention.

FIG. 1 is a diagram illustrating the structure of a principal part of the NOR-type non-volatile control circuit 10 in the form of a flash memory control circuit. The diagram illustrates the functions of the flash memory circuit in block form.

The flash memory control circuit 10 has sectionalized arrayed memory devices i.e., semi-conductor chips, 10A to 10N, depending on the number of bits included in the data. In the case of 8 bits, the memory has 8 arrayed memory devices which are used.

One embodiment of only one arrayed memory device 10A is described below as the arrayed memory devices 10A to 10N are all identical to each other. The arrayed memory device 10A consists of memory cells in a plurality of columns and rows, and is divided into two parts. For example, if the arrayed memory device 10A consists of 512 columns and 1024 rows, each of the divided arrayed memory devices (memory cell part) MX and MY consist of 512 columns and 512 rows.

The memory cells are equivalent to a single line from the memory cell parts MX and MY, in other words, the memory cells equivalent to one word line (512 columns×1 row), are used as dummy cells DC. With this invention, the memory cells in the first word line of the memory cell part MX are used in the dummy cell part termed DX, and the memory cells in the last word line of the memory cell part MY are used in the dummy cell part termed DY.

Cell control circuits 15, which have sense amplifiers between the memory cell parts MX and MY are structured so as to be connected in a direct row to the respective bit lines (the column lines).

The pair of memory cell parts MX and MY have one column decoder CD in common, and each pair of memory cell parts MX and MY has two row decoders LDX and LDY. The row decoders LDX and LDY are used partly for dummy cell parts DX and DY. A plurality of control lines through the cell control circuit 15 are connected to a cell control decoder SAD. The cell control decoder SAD also functions as an I/O port.

A control signal, supplied from the row decoders LDX and LDY for the selected word line, is shared with the memory device 10A to 10N.

Although not shown, the column decoders CD and the row decoders LDX and LDY receive address information provided from an external source, and decode the address information into row and column information. The cell control circuit 15 activates the memory control mode for the selected cell indicated by the row and column information.

Figure 2:
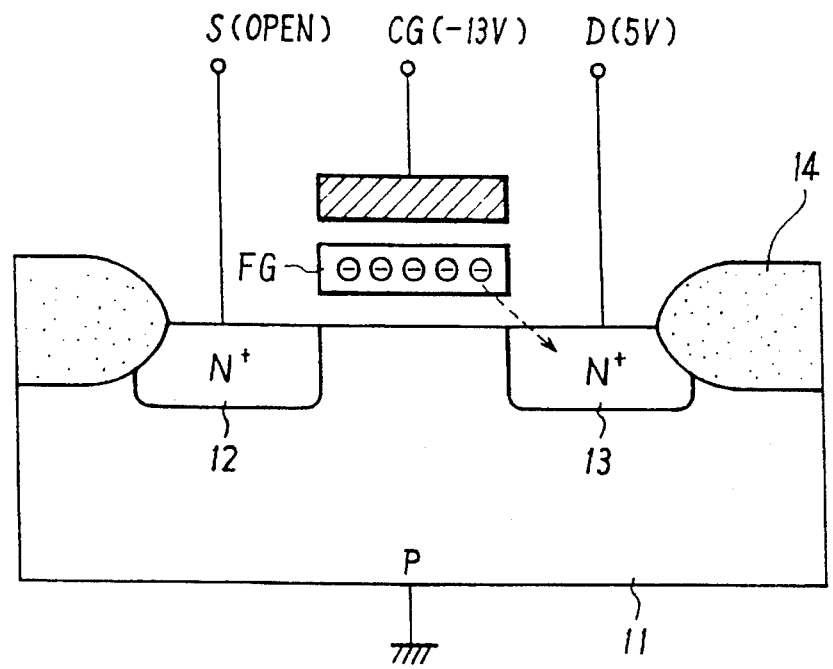
FIG. 2 is a sectional diagram illustrating the construction of a cell.

FIG. 2 illustrates the structure of a cell in the above flash memory control circuit. A source and a drain are formed by the n-type regions 12 and 13 in the p-type substrate 11. An insulating layer, such as SiO2 (not shown), lies on the upper side of the p-type substrate which is opposite a channel formed between the n-type regions 12 and 13, and a floating gate FG is formed on the insulating layer. A control gate CG is formed on a second insulating layer (not shown) lying on the floating gate. Reference numeral 14 denotes another insulating layer which provides the isolation from the adjacent cell.

A write operation in the cell is described below. The cell in which data is to be written is in an erased state, that is, a state in which a high threshold voltage Vth is produced by injecting electrons into the floating gate FG.

1) Writing "0" in the selected cell is described below. As a result of writing "0" in the selected cell, a so-called programmed state is produced in the selected cell.

As shown in FIG. 2, in order to program the selected cell,
a) The word line voltage Vcg of the selected cell is reduced to −13 volts:
b) A predetermined voltage (e.g., 5 volts) is applied to the drain D of the selected cell; and
c) A source S of the selected cell is opened or grounded.

Accordingly, because the electric field level increases between the floating gate FG and the drain D, the electrons injected into the floating gate FG move toward the drain D by FN-tunneling, and the electrons in the floating gate FG decrease. Finally, the electrons in the floating gate FG can be exhausted by controlling the programming time.

This is the programmed state, wherein the selected cell stores data "0". The threshold voltage Vth is lowered by the FN-tunneling of the electrons.

2) As a result of writing "1" in the selected cell, a so-called erased state is produced in the selected cell.

Figure 3:
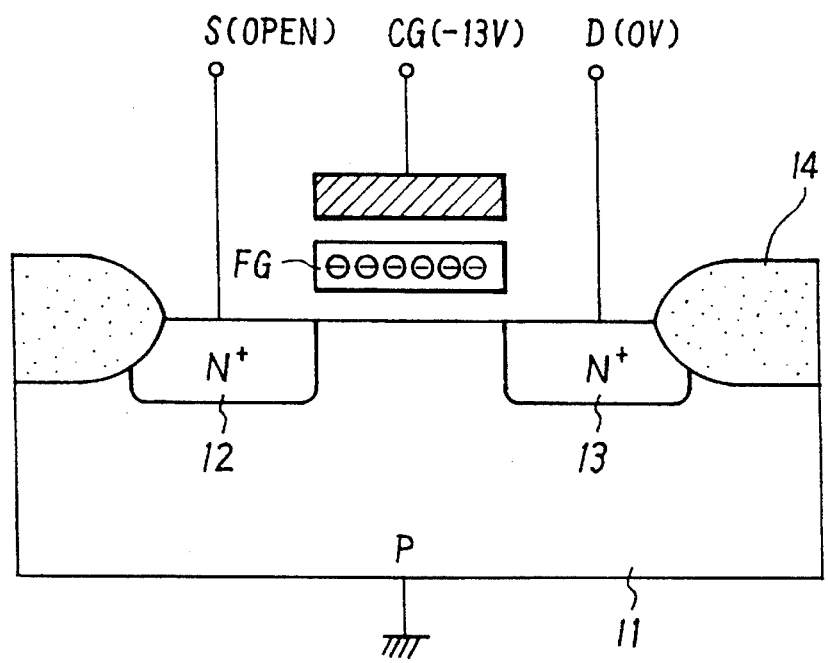
FIG. 3 is a sectional diagram illustrating the construction of the cell.

As shown in FIG. 3, in order to write "1" in the selected cell.
a) The word line voltage Vcg of the selected cell is reduced to, for example, −13 volts;
b) A predetermined voltage (e.g., 0 volt) is applied to the drain D of the selected cell; and
c) The source S of the selected cell is opened or grounded.

Because the applied electric field level between the floating gate FG and the drain D is insufficient, the electrons remain accumulated in the floating gate FG. This is the erased state, wherein the selected cell stores data "1". The threshold voltage Vth is high because the electrons do not produce the FN-tunneling.

As described above, the flash memory writes and erases the data by the cell, the bit line connected to the cell, the dummy cell DC connected to the bit line, and the cell control circuit 15.

Subsequently, a first preferred embodiment according to the present invention is as described below.

Figure 4:
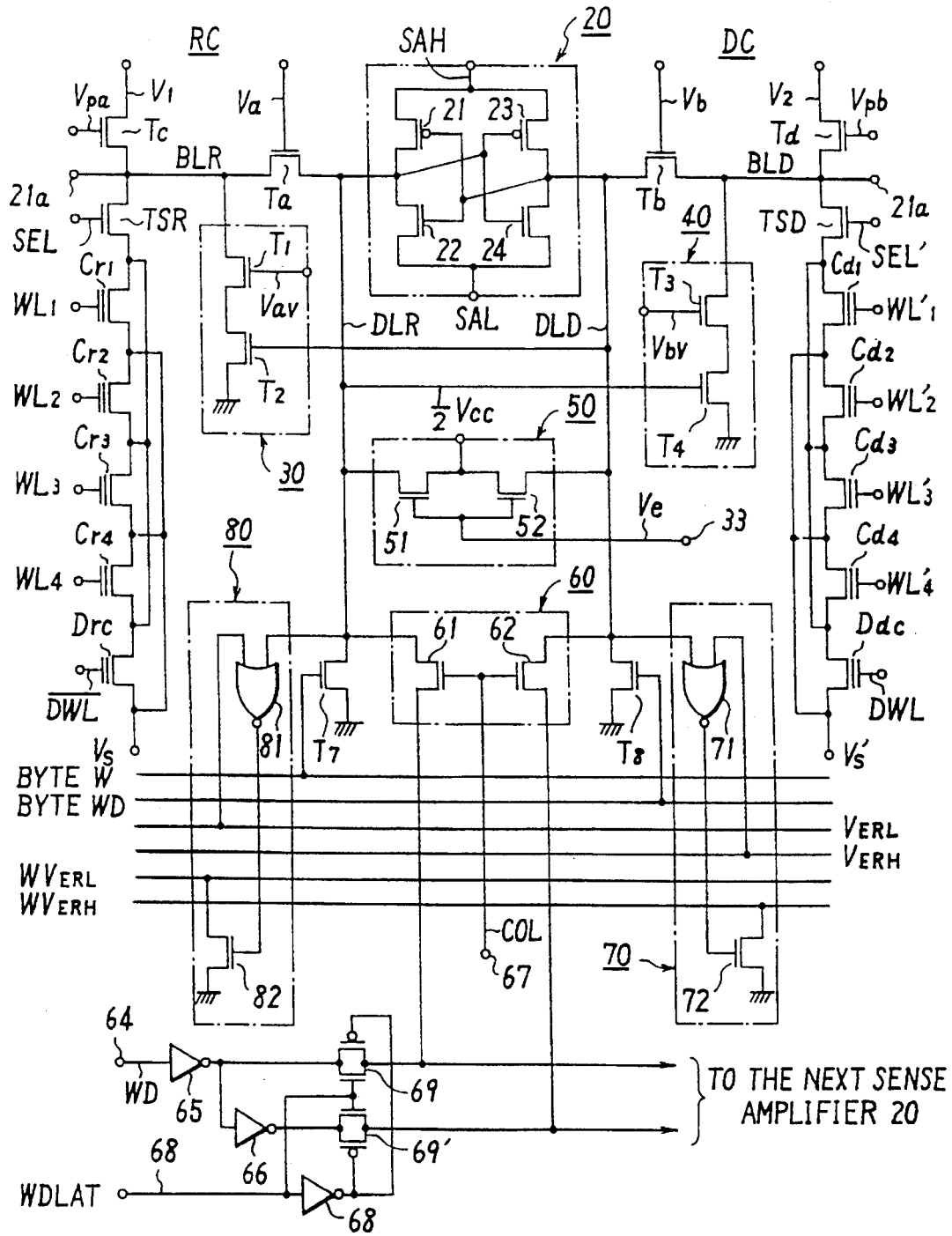
FIG. 4 is a connection diagram illustrating a cell control means in the first embodiment of the present invention.

FIG. 4 is a circuit diagram, illustrating the cell and the other parts connected to the cell, wherein the cell in FIG. 2 is expressed by the same symbol as a MOS transistor. The structure is described below.

In FIG. 4, reference character RC denotes a memory cell (a read cell) selected by the decoder. A terminal 21a is a decoder terminal for a bit line BL connected to the read cell RC. The bit line BL is connected to the dummy cell DC and to the cell control circuit 15. The read cell RC is one of the memory cell parts MX. One of the cells in the other memory cell parts MY is used as the dummy cell DC.

A dummy transistor Drc and four cells Cr1 to Cr4 are connected to the bit line in the read side via a select transistor TSR. The number of the cells connected to the select transistor TSR are the n-th power of two.

In the NOR-type flash memory, four cells. Cr1 to Cr4, and the dummy cell Drc are connected in a series. The sources of each of them are connected to each other and all of the drains of each of them are connected to each other. The reference character Vs denotes a voltage supplied to the sources. A description about the dummy cell DC is omitted because the structure is similar to the read cell.

The cell control circuit 15 has a sense amplifier 20 including latches. The sense amplifier 20 consists of four transistors 21 to 24. In the read cell side (the "RC side"), transistor 21 or 22 latches data. In the dummy cell side (the "DC side"), transistor 23 or 24 latches data.

Besides the sense amplifier 20, the cell control circuit 15 has a plurality of control means in the form of data receiving circuits 60) for providing the data to be latched or written. The structure of the control means will be described later in the description of operations.

Figure 5:
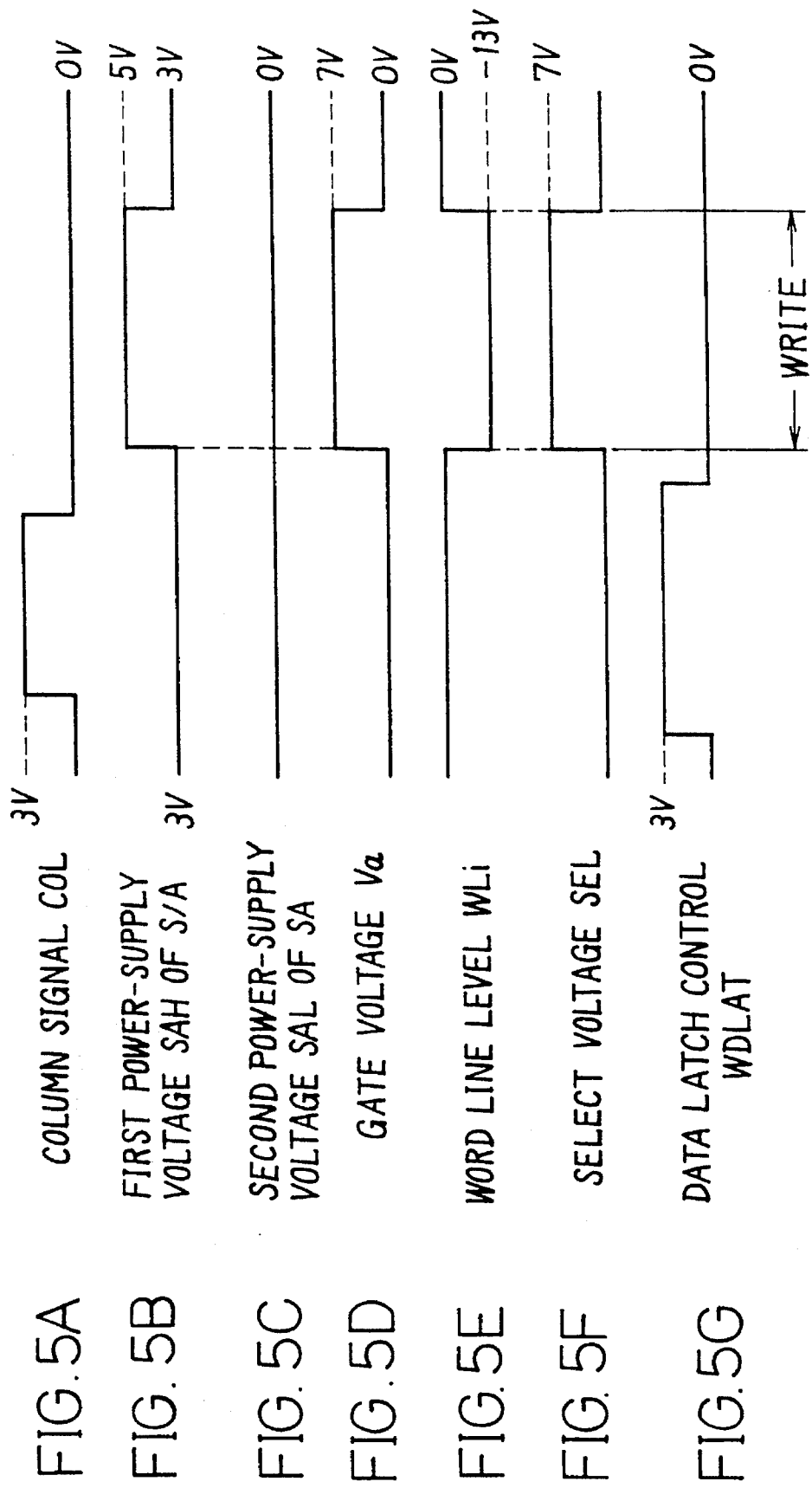
FIG. 5, comprised of FIGS. 5A–5G, is a wave form chart for explaining the write mode.

The write operation will be described below, in connection of FIG. 4 and FIG. 5.

At first, a data latch control signal WDLAT is increased, so that transfer transistors 69 and 69' are turned on. A power-supply voltage SAH at one of terminals of the sense amplifier 20 is increased (e.g., to 3 volts), and a power-supply voltage SAL at the other terminal is reduced (e.g., 0 volt), so that the sense amplifier 20 becomes active.

A control signal COL (FIG. 5A) supplied on the column lines of a terminal 67 is increased, so that the data receiving circuit 60 becomes active. Then, data to be written are transmitted to the drains of control transistors 61 and 62, and the transmitted data is latched in the sense amplifier 20.

As shown in FIG. 5B, when the sense amplifier 20 is driven by the voltage of more than 3.0 or 3.3 volts, it is driven by about 3 volts at first and thereafter the voltage is increased to 5 volts. In this case, a voltage booster is necessary for generating the power-supply voltage of 5 volts.

The data to be written (the high logic level H or a low logic level L), which is latched in the transistor 21 or 22 of the RC side of the sense amplifier 20, is used as a drain voltage for the cell in which data is to be written (the "selected cell").

Therefore, when the data to be written is "0", the data latched in the sense amplifier 20 must be high (data "1"). For this purpose, the data WD to be written, which is provided via an I/O terminal pin 64 of the flash memory, is inverted by inverters 65 and 66, and the inverted data is latched.

After latching the data, as shown in FIG. 5F, a voltage SEL is applied to the select transistor TSR so as to be turned on. As shown in FIG. 5E, the word line voltage of the selected cell is reduced to a predetermined voltage (−13 volts), thereby allowing the selected cell to be set in a write mode. A gate voltage Va (FIG. 5D) is applied to a gate transistor Ta to be turned on. Then, a voltage, corresponding to the data latched in the sense amplifier 20, is applied to the drain D of the selected cell.

When "0" is written in the selected cell, 5 volts is applied to the drain D of the selected cell because the latched data is "1". Accordingly, because the electric field level from the drain to the floating gate increases, the electrons in the floating gate produce FN-tunneling, thereby writing "0" in the cell. The selected cell is set in the programmed state.

When "1" is written in the selected cell, 0 volts is applied to the drain of the selected cell because the latched data is "0". Because the electric field level from the drain to the floating gate is insufficient, the electrons in the floating gate do not make the FN-tunneling. Accordingly, the selected cell remains in the erased state.

As described above, in the write operation, the data to be written is inverted, the inverted data is latched in the sense amplifier 20, and the voltage corresponding to the latched inverted data is applied to the drain of the selected cell.

Figure 6:
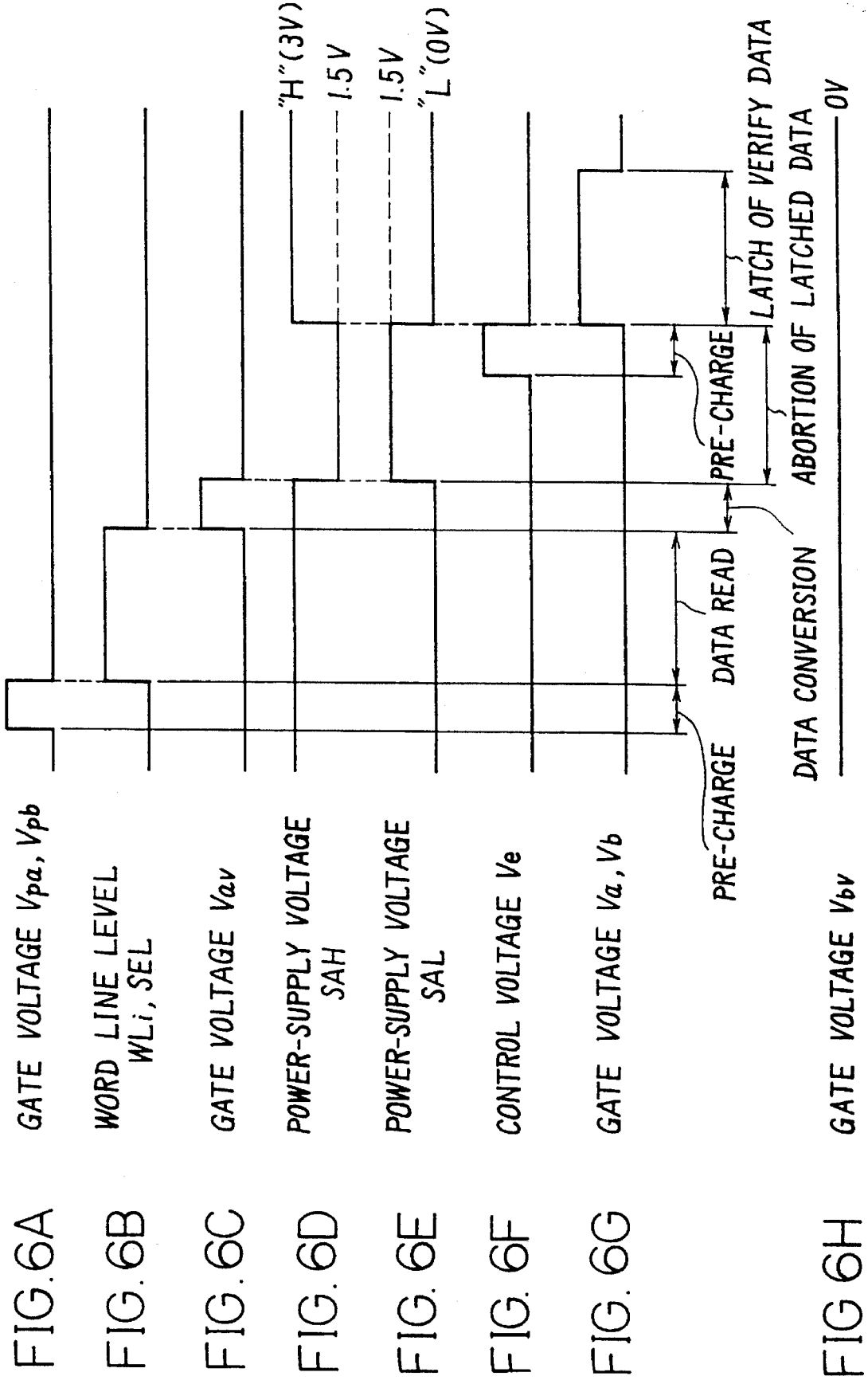
FIG. 6, comprised of FIGS. 6A–6H, is a wave form chart for explaining the verify mode.

The verify operation to check the written data is described below in connection with FIG. 4 and FIG. 6.

1) As shown in FIG. 6G, the gate voltage Va is reduced to 0 volts so that the gate transistor Ta is turned off. Then the RC side and the sense amplifier 20 side are isolated electrically from each other.
2) Gate voltages VPa and VPb (about 3 volts) are applied respectively to the gate transistors Tc and Td so as to pre-charge the BLR and BLD of the bit line BL (FIG. 6A). At this time, the pre-charged voltage of the RC side is slightly lower than that of the DC side. In this case, the comparison is V1<V2.3. On the RC side, as shown in FIG. 6B, a select level SEL (about 3 volts) is applied to the select transistor TSR and a word line level WLi (about 3 volts) is applied to the selected cell Cri (Cr1 to Cr4), so as to set the selected cell Cri in the read mode.

If the selected cell is in the programmed state, i.e., the cell state in which "0" is written, the bit line level BLR falls below the pre-charged voltage, because the cell current flows through the selected cell Cri.

If the selected cell is in the erased state, i.e., the state of the cell wherein "1" is written), the bit line level BLR holds the pre-charged voltage, because no cell current flows through the selected cell Cri.

4) On the DC side, when the gate voltage Vb holds 0 volts, a voltage of 3 volts is applied to a control line level SEL' of the select transistor TSD and to a word line level DWL of a dummy transistor Ddc.

Because the DC side is in the programmed state or in the erased state by the ultra-violet rays, the cell current flows through the dummy transistor Ddc, thereby reducing the dummy cell bit line level DWL below the pre-charged voltage.

5) The control line level SEL, on the RC side and the DC side, and the word line level WLi are reduced to 0 volts. Both the read cell RC and the dummy cell DC are isolated from the respective bit lines BL. As a result, BLR and BLD each hold respectively the bit line level corresponding to the data read just before ("0" or "1").

6) Next, necessary parts of the read data are converted. The conversion is the internal process for latching the data in the sense amplifier 20 without the provision of the data from the external device.

For this purpose, the flash memory has converters 30 and 40 for the bit line. Each converter consists of a pair of transistors T1 and T2 (or T3 and T4) connected in a series. The transistor T2 is connected to a data line DLD on the DC side, and the other transistor T4 is connected to a data line DLR on the RC side.

As shown in FIG. 6C, a gate voltage Vav of about 3 volts is applied to the gate transistor T1, which is then turned on. At this time, the data written just before are latched in the sense amplifier 20. When the selected cell stores "0", the data line DLD on the DC side is low. Accordingly, the control transistor T2 remains off, and the bit line BLR on the RC side holds the level which is given just after the read operation.

On the other hand, when the data written in the selected cell just before is "1", the data line DLD on the DC side remains high. Accordingly, the control transistor T2 is turned on, thereby pulling down the bit line level BLR on the RC side from the level applied just after the read operation to 0 volts.

As described above, when the data written in the selected cell just before is "1", the bit line on the RC side is reduced to 0 volts. The data of the bit line is converted from the high level H to the low level L.

If the operation of writing "0" in the selected cell Cri is incomplete, a re-write operation becomes necessary. Then, the bit line holds the pre-charged voltage because the selected cell Cri is in the same state as the state for storing "1".

Further, when the verify operation determines that "0" is written in the cell completely, the bit line holds 0 volt because the sense amplifier 20 latches low.

FIG. 7 shows the correlation between the data to be written and the bit line level in the conversion of the data.

7) Next, the gate transistor T1 is turned off and the same voltages, e.g., a middle voltage such as approximately 1.5 volts, are applied to the sense amplifier 20 as the power-supply voltage SAH and SAL, so that the latched data in the sense amplifier 20 is aborted (FIG. 6D and FIG. 6E).

8) Simultaneously, a control voltage Ve is applied to a pre-charge circuit 50 via a terminal 33, so that the pair of transistors 51 and 52 connected in a series are turned on and a pair of the data lines DLD and DLR are pre-charged. In this embodiment, VCC/2 (about 1.5 volts) is employed as the pre-charged voltage.

9) After aborting the latched data and pre-charging the data lines DLD and DLR, the gate voltages Va and Vb are applied respectively to the gate transistors Ta and Tb, which are turned on. Three volts is applied as the power-supply voltage SAH and 0 volts is applied as the other power-supply SAL, so that the sense amplifier 20 becomes active.

10) Then, because the respective bit lines on the RC side and on the DC side are connected to the sense amplifier 20, differences in data due to differences in voltage between two bit line levels (BLR minus BLD) are sensed and latched in the sense amplifier 20.

In other words, when "0" is written in the selected cell Cri and the selected cell is programmed incompletely, the bit line level BLR is equal to the pre-charged voltage. Because the bit line level BLR is higher than the bit line level BLD on the DC side, the sense amplifier 20 (on the RC side) latches high (H).

In the other hand, when "0" is written in the selected cell and the cell is in the programmed state, the sense amplifier 20 latches low, because the bit line is 0 volts.

When the data written is "1" or the cell is determined to be programmed completely during the verify mode, the bit line level BLR is equal to the pre-charged voltage. When the data written is "1", because the control transistor T2 is on, the bit line level BLR has been reduced to 0 volts by turning on the gate transistor T1. Accordingly, the bit line level BLR is lower than the level BLD on the DC side, and the sense amplifier 20 latches low.

Therefore, in the verify mode, the bit line level BLR on the RC side is higher than the bit line level BLD on the DC side, and the sense amplifier 20 latches high (H) only when the selected cell is programmed incompletely. Then, the low level L, latched in the sense amplifier 20, becomes an anti-selection voltage, that is voltage applied to the drain in order to inhibit the data from being re-written, for the selected cell. FIG. 8 shows the correlation between the state of the read cell RC and the latched data in the verify mode.

If the cell programmed incompletely is detected in the verify mode, the re-program or re-write operation is performed on only on that cell. As shown in FIG. 9, in the re-program operation, the word line level WLi is reduced to −13 volts, and only the gate transistor Ta is turned on (Va=7 volts).

Because the sense amplifier 20 latches high (data "1") in the verify operation, approximately 5 volts is applied to the drain D of the cell Cri to be re-programmed, thereby re-writing "0" in the cell Cri. Thus, it is unnecessary to receive the data for the re-program operation from the external source.

Figure 10:
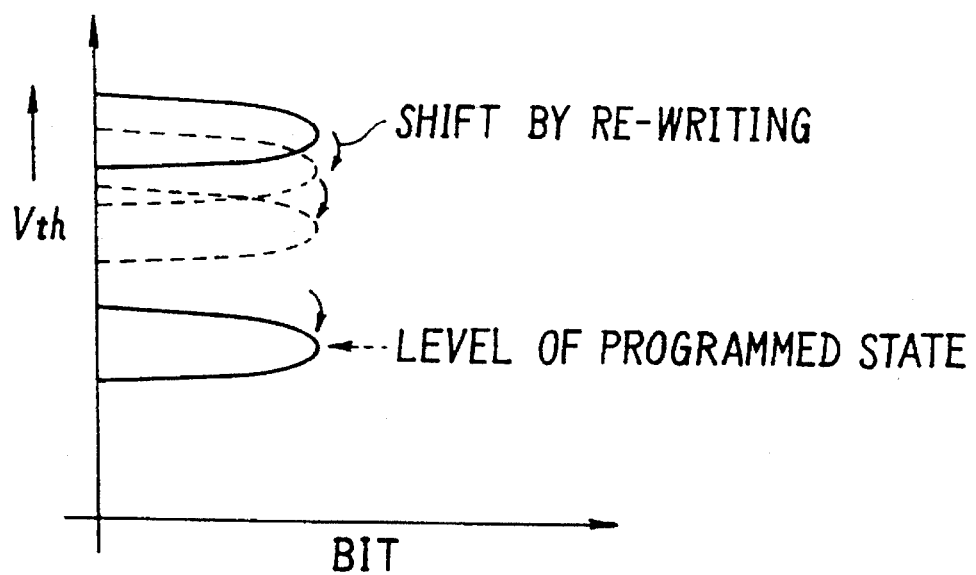
FIG. 10 is a chart showing the distribution of threshold levels.

The shift of the threshold level Vth stops at that point in the rewrite operation, because the cell which is determined to be programmed completely is not re-programmed (FIG. 10).

In view of the distribution of the threshold levels Vth, the programming of the NOR-type flash memory, which programs and erases using FN tunneling according to this invention, is equivalent to the erase operation of the NOR-type flash memory programming using CHE.

Figure 11:
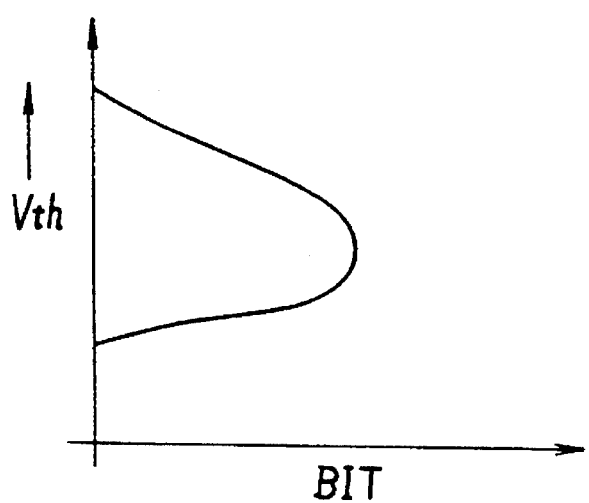
FIG. 11 is a diagram showing the distribution of the threshold levels in a conventional memory.

In the erase operation of the programming method using CHE, the cell is checked by the verify operation after a short erasing pulse is given to the cell. Then, if at least one cell erased incompletely is detected, the short erasing pulse is provided for the whole block, erasing the whole block. As a result, cells erased completely are erased again. When the whole erased block is erased, the threshold levels Vth of the cells fall maintaining the same degree of dispersion. Accordingly, the threshold levels show a broad distribution after the erase operation, as shown in FIG. 11.

In the embodiment according to the present invention, because of the programming method of the verify operation using FN tunneling by bits, only the cells programmed incompletely are re-programmed, and the cells erased completely are prevented from being re-programmed. Accordingly, because the threshold levels of the cells which are prevented from being programmed are not thereby reduced, the threshold levels Vth of the respective cells are equal to each other, and the distribution of the levels is therefore sharp and dense as shown in FIG. 10.

The sharp and dense distribution of the threshold levels permits the upper limit of the threshold level Vth to be high and to be used as a basis for determining whether the accessed cell is in the programmed state or in the erased state. In other word, the margin for the read operation is quite broad. Accordingly, the reading speed is increased.

Because only the cells programmed incompletely are re-programmed, the problem of the surplus erased state is also solved.

The verify operation has been described above. The read mode is described below, in connection with FIG. 4 and FIG. 12.

1) Gate voltages VPa and VPb are applied to the bit line BL, which is pre-charged. Thereafter, the gate transistors Tc and Td are turned off and the relationship of pre-charged voltages between V1 and V2 is V1<V2.

2) On the RC side, the select transistor TSR and the selected cell Cri to be read are turned on so as to be set in the read mode. On the DC side, the select transistor TSD and the dummy transistor Ddc are turned on.

3) Simultaneously, the data latched in the sense amplifier 20 is aborted, and the pair of data lines DLR and DLD are pre-charged. Since this process is similar to the operation described above, a detailed description is omitted.

4) After the data in the read cell is loaded on the bit line BL, the gate transistors Ta and Tb are turned on so that the bit line BL is connected to the sense amplifier 20. Then, the sense amplifier 20 (on the RC side) becomes active so as to amplify the read data on the bit line BL.

5) Thereafter, the latched data in the sense amplifier 20 is transferred through a column line COL to the I/O terminal via the data line DLR, DLD and the data receiving circuit 60.

6) Selecting the necessary column line COL is the paginal read operation. For example, with a memory chip that consists of 512 columns and 1024 rows as described above, one page consists of 512 columns and one row. Accordingly, the respective data receiving circuits 60 are successively turned on, switching over from one column line to another through a memory device.

In programming per byte, because one word line stores the data at a stroke, it is necessary for "1" to be latched in the sense amplifiers, except the sense amplifier connected with the cells to be programmed, so as to inhibit the data "0" from being written in an appropriate cell.

Transistors T7 and T8 are used for this purpose. The operation, which is described below, is performed on the sense amplifier 20 selecting the cells not to be programmed. Before the data to be written is latched in the sense amplifier, a control line BYTEWD connected with all sense amplifiers is reduced in order to turn off all transistors T8 connected to the same control line, and another control line BYTEW is increased.

Accordingly, because the data line DLR connected to the same control line BYTEW (on the RC side of the sense amplifier 20) is set low, the sense amplifier 20 latches high according to the data lines DLD on the opposite side.

After latching, the transistor T7 is turned off. Thereafter, the data receiving circuit 60, corresponding to the cell to be programmed, becomes active so as to be set in the write mode. Because the cells, other than the selected cell in which data is to be written, stores "1", the other cells are not programmed. Accordingly, it is possible to program the cell selectively.

In the paginal program operation, it is necessary to determine whether the program operation for one page has been completed or not. Then, if at least one cell programmed incompletely is detected, that cell must be re-programmed. This is why it is necessary to determine whether the program operation for one page has been completed or not.

As shown in FIG. 4, reference numeral 70 denotes the paginal program determination circuit. The paginal program determination circuit 70, consisting of a NOR gate 71 and a control transistor 72, is set in an initial state by a control line a verify line, VERH, and determines the programmed state by another control line, i.e., a word verify line WVERH.

An embodiment of the paginal program determination is described below in connection with FIG. 13 and FIG. 14. FIG. 13 shows a situation in which the cell programmed incompletely is detected, and FIG. 14 shows a situation in which all of the cells are completely programmed.

1) At first, in the paginal program determination, the verify line VERH is increased so that the output from the NOR gate 71 turns off the transistor 72. A pre-charge circuit (not shown) pre-charges the word verify line WVERH at a high level.

2) After being pre-charged, the verify line VERH is reduced.

3) As described above, when the read cell is programmed incompletely in the read mode, the data line DLD will fall to a low level, because the RC side in the sense amplifier 20 latches high (H) and the DC side latches low.

Therefore, as described in FIG. 13, when the verify line VERH is reduced, the output of the NOR gate 71 is increased ("1") so that the transistor 72 is turned on, thereby reducing the word verify line WVERH to 0 volts.

On the other hand, when the cell is completely programmed or stores "1", the DC side of the sense amplifier 20 latches high, and the output from the NOR gate 71 is reduced so that the transistor 72 is turned off. Then, the word verify line WVERH holds the pre-charged voltage as shown in FIG. 14.

As described above, when at least one cell is programmed incompletely, it is possible to determine the state of the cell for one page, i.e., one word line, connected with the word line, by detecting the level of the word verify line WVERH, because the word verify line WVERH is at a low level. If the cell is determined to be programmed incompletely, the current mode of the word line is set in the program mode and shifts into the verify mode thereafter.

Regarding the check of the erase operation in the cell, an erase determination circuit 80, related to the data line DLR of the RC side in the sense amplifier 20, determines the erased state of the respective cells as shown in FIG. 4.

The erase determination circuit 80, consisting of a NOR gate 81 and a control transistor 82, is set in an initial state by a corresponding control line, i.e., a verify line, VERL, and determines the erased state by another control line, i.e., a word verify line, WVERL.

FIG. 15 shows a situation in which at least one cell that was erased incompletely is detected, and FIG. 16 shows a situation in which all the cells are erased completely. The erase determination operation is described below in connection with FIGS. 15 and 16.

1) At the end of the read mode, the data corresponding to the read data is latched in the sense amplifier 20.

2) The verify line VERL is pulled high and the output of the NOR gate 81 is pulled low, so that the transistor 82 is turned off. Then, the pre-charge circuit (not shown) pre-charges the word verify line WVERL at a high level.

3) The verify line VERL is then reduced.

4) The latched data in the sense amplifier 20 is at a high level, because no cell current flows in the cell erased completely during the read operation. Accordingly, when the cell is erased completely, because the data line DLR remains at a high level, the output of the NOR gate goes low and the transistor 82 remains off after being pre-charged. Therefore, the word verify line WVERL holds low (as shown in FIG. 15).

On the other hand, if the cell is erased incompletely, the latched data in the sense amplifier 20 is at a low level because the cell current flows out. The output of the NOR gate 81 is inverted to be high in order to turn on the transistor 82. Therefore, the word verify line WVERL is inverted to be low after being pre-charged (as shown in FIG. 16).

As described above, because the inversion of the word verify line WVERL depends on the erased state of the cell, it is possible to determine whether the erase operation to the cells on the selected word line has been completed or not, merely by detecting the level of the word verify line WVERL.

In the embodiment shown in FIG. 4, in the re-program operation for the cell in which the data is written incompletely, the bit line BLR is reduced by the bit line converters 30 and 40. Moreover, such conversion is feasible without the converters 30 and 40.

Subsequently, a second preferred embodiment according to the present invention is described below.

Figure 17:
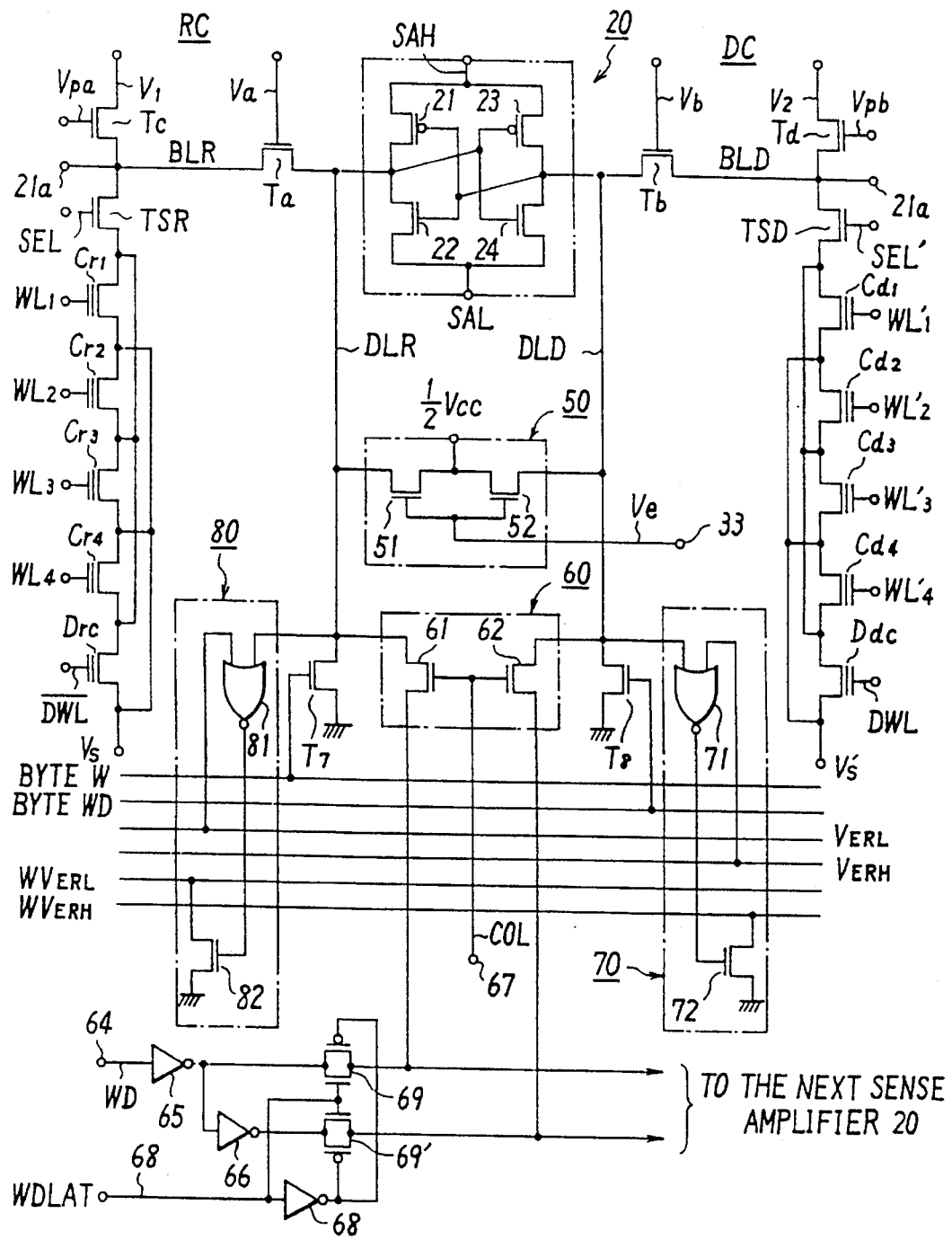
FIG. 17 is a systematic diagram illustrating the second embodiment according to the present invention.

FIG. 17 shows another embodiment of the cell control circuit 15, which permits conversion without the converters 30 and 40. As the structure of this embodiment is similar to the structure shown in FIG. 4 except for the converters 30 and 40, repetitive description is omitted.

FIG. 18 shows the embodiment of the conversion.

As described above, because the sense amplifier 20, corresponding to the cell not to be programmed, latches low, the drain voltage of the cell is 0 volts and no electrons move. If the data are read in the verify operation in this state, the bit line level BLR on the DC side will be higher than the bit line level BLD and the sense amplifier 20 will latch at a high level ("1"), because there is no cell current flow. Then, because the drain voltage is 5 volts in the re-program operation, the selected cell is set in the programmed state by the movement of the electrons.

To prevent this, as shown in FIG. 18, before the word line level WLi is applied, the gate transistor Ta is controlled so as to allow the pre-charged bit line level BLR to be equal to the RC side of the sense amplifier 20.

Accordingly, for example, when the latched data in the sense amplifier 20 is high, the bit line level BLR is unchanged as long as the gate transistor Ta is turned on. Thereafter, in the read operation, the stored data in the selected cell is read from the selected cell, causing the bit line level BLR to be changed in accordance with the state of the cell.

When the latched data in the sense amplifier 20 is low, the bit line level BLR falls gradually to zero when the transistor is turned on.

As shown in FIG. 18, the bit line level BLR is reduced by turning on the gate transistor Va after being pre-charged. The bit line level for the cell which is not programmed remains at a low level after the read operation.

As the result, when the gate transistor Ta is turned on again, a level that is the same level as the bit line level BLR is latched in the sense amplifier 20. Accordingly, the cell which is not programmed is prevented from being wrongly re-programmed in the re-write mode.

Further, the channel in the gate transistor Ta is longer than the channel of N-channel transistor in the sense amplifier 20, so as to prevent latched data in the sense amplifier 20 from being inverted (from a low level into a high level) when the gate transistor Ta is on.

It is also feasible to program by shifting the gate voltage by two stages (e.g., shifting from 0 volt to Vcc/2, thereafter from Vcc/2 to Vcc).

In the embodiment described above, the power supply of the semiconductor (the memory chip) is 3 or 3.3 volts. If 5 volts must be applied to the drain of the cell which needs 5 volts, the power supply may be boosted to 5 volts by the voltage booster described above.

In the operations of the sense amplifier 20, when the bit line level BLR on the RC side is higher than the bit line level BLD on the DC side (in other words, in accordance with the difference in voltage in the bit line BL), the sense amplifier 20 latches high. Accordingly, in order to avoid the malfunction, the pre-charged voltage on the RC side is set lower than that on the DC side.

It is also possible to produce the difference in voltage described above by setting the channel width W of the gate transistor Ta on the RC side to be wider than that of the gate transistor Tb on the DC side. In this case, the bit line level BLD on the DC side is the middle voltage between the high level on the RC side and the low level.

As described above, the NOR-type non-volatile memory control circuit, according to the present invention, re-writes selectively using FN-tunneling only in a cell in which the data is written incompletely during the write/erase operation by FN-tunneling.

Accordingly, because the data is prevented from being written in the cell in which data is written completely, the dispersion of the threshold levels is kept narrow so that the margin for the read operation can be set widely.

Besides the paginal write operation, the write operation per byte is feasible so that the flexibility in the write operation is improved.

Because the page based program/erase determination process is simple, the paginal determination process has the advantage of providing for easy re-writing.

While the preferred embodiment of the invention has been described above, it will be understood that various modifications may be made thereto, and the invention is intended to cover with the appended claims all such modifications as may fall within the true spirit and scope of the invention.

What is claimed is:

1. A NOR-type non-volatile memory control circuit having a plurality of bit lines for writing and erasing data in memory cells using a tunnel current and for writing and verifying data per word line repeatedly, said NOR-type non-volatile memory control circuit comprising:

cell control means having a sense amplifier for each bit line and providing an anti-selection voltage for preventing writing of data in any cell in which data has been written sufficiently complete so as to permit a subsequent read operation, said control means providing said anti-selection voltage in bit lines corresponding to the cells being completely written during a re-writing operation which is performed after a verification operation, said verification operation identifying the cells in which data has been completely written.

2. A NOR-type non-volatile memory control circuit having a plurality of bit lines for writing and erasing data in memory cells using a tunnel current and for writing and verifying data per word line repeatedly, said NOR-type non-volatile memory control circuit comprising:

cell control means having a sense amplifier for each bit line and providing an anti-selection voltage for preventing writing of data in any cell in which data has been written sufficiently complete so as to permit a subsequent read operation, said control means providing said anti-selection voltage in bit lines corresponding to the cells being completely written during a re-writing operation which is performed after a verification operation, said verification operation identifying the cells in which data has been completely written;

wherein said cell control means provides, at the time data is being written or verified on a byte basis, said anti-selection voltage which prevents data from being written in any cell in which data is not being written.

3. A NOR-type non-volatile memory control circuit having a plurality of bit lines for writing and erasing data in memory cells using a tunnel current and for writing and verifying data per word line repeatedly, said NOR-type non-volatile memory control circuit comprising:

cell control means having a sense amplifier for each bit line and providing an anti-selection voltage for preventing writing of data in any cell in which data has been written sufficiently complete so as to permit a subsequent read operation, said control means providing said anti-selection voltage in bit lines corresponding to the cells being completely written during a re-writing operation which is performed after a verification operation, said verification operation identifying the cells in which data has been completely written;

said memory cells being grouped into a plurality of pages; and a page program determination circuit having a control line corresponding to each page for determining on a page basis which cells do not have data completely written, said page program determination circuit detecting a change in voltage occurring on said control line which is related to a voltage on said bit line at the time of said verification operation occurring immediately after data has been written into said cells.

4. The NOR-type non-volatile memory control circuit in accordance with claim 1, wherein data is re-written according to an output provided from said cell control means only in cells existing with data incompletely written as determined by said verification operation, said verification operation being performed on a page basis.

5. A NOR-type non-volatile memory control circuit for use with a memory circuit having at least one memory cell with an associated bit line and a dummy cell with an associated dummy bit line, comprising:

a sense amplifier having a first input connected to the bit line for said memory cell and a second input connected to the dummy bit line connected to the dummy cell, said sense amplifier sensing a first voltage on said bit line and a second voltage on said dummy bit line and latching said bit line and said dummy bit line based upon a difference between said first voltage and said second voltage; and means for verifying a complete programming of said memory cell by causing said sense amplifier to latch high on one of said bit line or said dummy bit line only when said memory cell has been programmed incompletely.

6. The NOR-type non-volatile memory control circuit as set forth in claim 5, wherein said verifying means comprises a converter circuit for reducing said first voltage on said bit line when said memory cell has been completely programmed, thereby causing said sense amplifier to latch low on said bit line.

7. The NOR-type non-volatile memory control circuit as set forth in claim 5, wherein said memory cell is associated with an entire page of memory cells and said verifying means simultaneously verifies a programming of all memory cells in said page.

* * * * *